(12) United States Patent
Nguyen et al.

(10) Patent No.: US 10,547,477 B2
(45) Date of Patent: Jan. 28, 2020

(54) EDGE-BASED COMMUNICATION WITH A PLURALITY OF SLAVE DEVICES USING TIMERS

(71) Applicant: Infineon Technologies AG, Neubiberg (DE)

(72) Inventors: Dinh Quoc Thang Nguyen, Villach (AT); Dirk Hammerschmidt, Finkenstein (AT)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 16/225,556

(22) Filed: Dec. 19, 2018

(65) Prior Publication Data

US 2019/0199558 A1 Jun. 27, 2019

(30) Foreign Application Priority Data

Dec. 21, 2017 (DE) .......................... 10 2017 130 933

(51) Int. Cl.
| | |
|---|---|
| *H04L 25/49* | (2006.01) |
| *H04W 56/00* | (2009.01) |
| *H04L 12/40* | (2006.01) |
| *H04W 84/20* | (2009.01) |

(52) U.S. Cl.
CPC .......... *H04L 25/4902* (2013.01); *H04L 12/40* (2013.01); *H04W 56/001* (2013.01); *H04L 2012/40273* (2013.01); *H04W 84/20* (2013.01)

(58) Field of Classification Search
CPC ................. H04L 25/4902; H04L 12/40; H04L 2012/40273; H04L 12/403; H04W 56/001; H04W 84/20; H03K 7/08
See application file for complete search history.

(56) References Cited

U.S. PATENT DOCUMENTS

| | | |
|---|---|---|
| 2015/0236876 A1 | 8/2015 | Cadugan et al. |
| 2015/0270994 A1 | 9/2015 | Scherr et al. |
| 2016/0050089 A1 | 2/2016 | Strasser et al. |
| 2016/0190802 A1* | 6/2016 | Binder .................. A63F 13/332 307/41 |

* cited by examiner

*Primary Examiner* — Vineeta S Panwalkar
(74) *Attorney, Agent, or Firm* — Design IP

(57) ABSTRACT

Slave devices, master devices, systems and methods are disclosed for bidirectional edge-based pulse width modulation protocol based communication. In an implementation, receiving a master trigger signal starts a timer having an associated time period in a slave device, and after the timer has elapsed the slave device transmits a response.

18 Claims, 5 Drawing Sheets

EDGE-BASED COMMUNICATION WITH A PLURALITY OF SLAVE DEVICES USING TIMERS

FIELD

The present application relates to master and slave devices, systems and methods for edge-based communication with a plurality of slave devices.

BACKGROUND

For communication between devices, for example in automotive applications, various protocols are used. One protocol frequently employed is the SENT protocol (single edge nibble transmission). This protocol may for example be used in applications where high resolution data is transmitted for example from a sensor device to an electronic control unit (ECU).

The SPC protocol (short PWM code; PWM meaning pulse width modulation) is an extension of the SENT protocol and aims at increasing performance of a communication link and reducing system costs at the same time. To some extent, SPC allows bidirectional communication and is an example of an edge based PWM protocol. For example, SPC may introduce a half-duplex synchronous communication. A receiver (e.g. master) generates for example a master trigger pulse on a communication line by pulling it low for a defined amount of time. The pulse width (corresponding to the defined amount of time) is measured by a transmitter (e.g. slave), for example a sensor, and a transmission, e.g. a SENT transmission, is initiated only if the pulse width is within a defined limit. The SPC protocol allows choosing between various protocol modes. For example, a synchronous mode, a synchronous mode with range selection or a synchronous transmission with identification (ID) selection (also referred to as busmode), where up to four sensors may be connected in parallel to an ECU or other master device, may be used. In the latter case, the pulse width of the above-mentioned trigger pulse conventionally may define which sensor or other entity will start a transmission. For example, a length of the trigger pulse may indicate an ID of a sensor or other slave device selected for transmission. The sensor or other entity may start the transmission with its own synchronization, which may overlap the trigger pulse.

Conventionally, when using the SPC protocol in the above-mentioned busmode, each sensor may have a different length of the trigger pulse associated therewith. In the conventional SPC protocol, triggering a sensor by a trigger pulse has a comparatively long duration (for example about 90 time units for addressing, e.g. the trigger pulse, and at least about 281 time units for responding of the sensor) and therefore takes a comparatively long time. Additionally, between triggering of different sensors in some conventional approaches at least the longest possible transmission duration plus a safety margin has to be kept.

Further, conventional approaches attempting to reduce the time needed are disclosed in US 2015/0236876 A1 or US 2016/0050089 A1.

Some conventional approaches may require a slave device to "listen" to the bus all the time and detect transmissions from other slave devices and their termination. This may require comparatively complex receive hardware and/or logic in slave devices, which may be undesirable.

SUMMARY

A slave device as defined in claim 1, a master device as defined in claim 7, a communication system as defined in claim 12 and a communication method as defined in claim 15 or 19 are provided. The dependent claims define further embodiments.

According to an embodiment, a slave device is provided, including: a communication circuit configured to communicate based on a bidirectional edge-based pulse width modulation protocol; and a timer configured to elapse an associated time period after a starting of the timer and to start when the communication circuit receives a predefined trigger signal, where the communication circuit is configured to transmit a response to the trigger signal when the timer elapses, and where the associated time period has a length to accommodate at least one further response by an at least one further slave device.

According to another embodiment, a master device is provided, including: a communication circuit configured to communicate based on a bidirectional edge-based pulse width modulation protocol, where the master device is configured to send a predefined trigger signal to a plurality of slave devices, and to receive responses from at least some of the plurality of slave devices in response to the trigger signal one after the other, and where the communication circuit is configured to transmit a predefined completion signal after each received response.

According to yet another embodiment, a communication system is provided, including: a master device, including: a communication circuit configured to transmit a master trigger signal on a bus; and a plurality of slave devices coupled to the bus, each slave device including: a communication circuit coupled to the bus; and a timer configured to elapse after a respective associated time period after it has been started, and to start when the communication circuit of the respective slave device receives the master trigger, where the communication circuit is configured to transmit a response to the master trigger signal when the timer elapses, and where associated time periods of different slave devices differ from each other.

According to another embodiment, a communication method is provided, including: receiving a master trigger signal according to a bidirectional edge-based pulse width modulation protocol; starting a timer in response to receiving the master trigger signal, where the timer elapses after an associated time period after starting; and transmitting a response to the master trigger signal when the timer elapses, where the associated time period has a length to accommodate at least one further response by a further slave device.

According to a further embodiment, a method is provided, including: sending a master trigger signal according to a bidirectional edge-based pulse width modulation protocol over a bus, in a plurality of slave devices; starting a respective timer in each slave device responsive to receiving the master trigger signal; and, in each of the plurality of slave devices, transmitting a response when the timer of the respective slave device has elapsed, where timers of different slave devices elapse after different associated time periods.

The above summary merely gives a brief overview over some features of some embodiments and is not to be construed as limiting, as other embodiments may include other features than the ones listed above.

DETAILED DESCRIPTION

Figure 1:
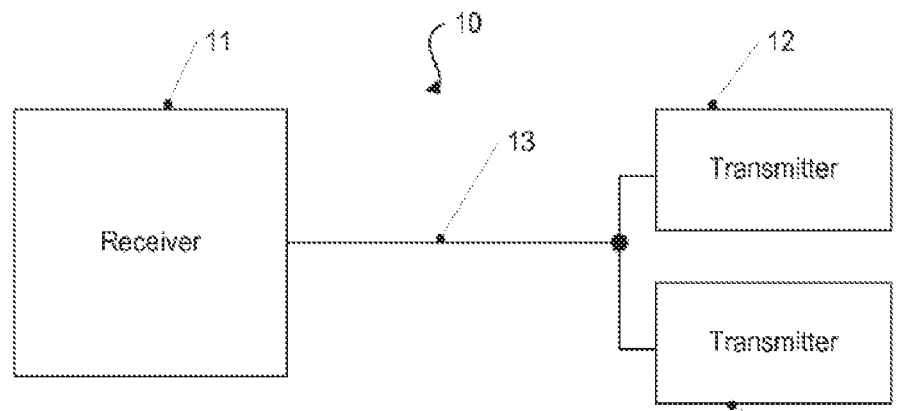
FIG. 1 is a simplified block diagram of a communication system according to some embodiments.

In the following, various embodiments will be described in detail referring to the attached drawings. The embodiments are to be regarded as illustrative examples only and are not to be construed as limiting. For example, while embodiments may be described as comprising a plurality of features or elements, in other embodiments some of these features or elements may be omitted, and/or replaced by alternative features or elements. In yet other embodiments, additional features or elements may be provided.

Any connections or couplings shown in the drawings or described herein may be implemented as direct connections or couplings, i.e. connections or couplings without intervening elements, or indirect connections or couplings, i.e. connections or couplings with one or more intervening elements, as long as the general purpose of the connection or coupling, for example to transmit a certain kind of signal and/or to transmit a certain kind of information, is essentially maintained. Connections or couplings may be wire-based connections or couplings or may also be wireless connections or couplings unless noted otherwise.

Furthermore, features from different embodiments may be combined to form additional embodiments. Variations and modifications described for one embodiment may also be applied to other embodiments.

In embodiments, an extension to the SPC protocol is proposed. However, this extension may also be applicable to other communication protocols, for example other bidirectional edge-based PWM (pulse width modulation) communication protocols.

A bidirectional edge-based pulse width modulation communication protocol generally is a protocol where communication is based on pulse width modulated signals, such that e.g. distances in time between signal edges encode data to be transmitted as well as control information. An edge-based PWM protocol may be a protocol where edges of pulse width modulated signals are detected, and information like data to be transmitted is encoded e.g. in pulse lengths of the pulse width modulated signal. Besides the SPC protocol, another non-limiting example for such a protocol is the SENT protocol.

In some embodiments, in a bidirectional edge-based PWM communication system comprising master devices and a plurality of slave devices (i.e., at least two slave devices), a master trigger signal triggers a data transmission in at least a first slave device of the plurality of slave devices and a second slave device of the plurality of slave devices. The first slave device and the second slave device may transmit data to a controller or other master device, for example consecutively transmit data to the controller, in response to the master trigger signal.

In some embodiments discussed herein, each slave device includes a timer. A timer, as used herein, generally is to be understood as a circuit used for measuring a time, in particular a predetermined (associated) time period. For example a timer may count backwards from a predetermined number to zero, and the reaching of zero means that the timer is elapsed and the time period is reached. In other embodiments, a timer may count upwards from zero until a predefined value indicating the time period is reached. In still other embodiments, counting may start from an arbitrary value until another value which differs from this arbitrary value according to the predetermined time period is reached. When the time period is reached, the timer may be referred to as elapsed. Therefore, the implementation of timers is not particularly limited. Starting of the timer is triggered by successfully detecting the trigger pulse at the respective slave device, and the respective slave device starts sending data when its trigger has elapsed. Various associated time periods until the timer elapses are provided to different timers, such that the sensors send their data consecutively. To avoid collisions, the various associated time periods until the trigger elapses may be selected for the respective slave device to include safety margins. These and other techniques will be discussed below in more detail.

In FIG. 1, a communication system 10 according to an embodiment is shown including a receiver 11 and transmitters 12, 14. Receiver 11 is communicatively coupled to transmitters 12, 14 via one or more communication paths at 13. In one embodiment, receiver 11 is part of one integrated circuit chip and transmitters 12, 14 are part of other integrated circuit chips. In other embodiments, receiver 11 and transmitters 12, 14 may be part of a same integrated circuit chip. In one embodiment, receiver 11 may be a controller, for example an ECU. In some embodiments, transmitters 12, 14 may be sensors or other devices. In some embodiments, receiver 11 and transmitters 12, 14 may communicate via a SPC protocol or other bidirectional edge-based PWM protocol. In other embodiments, other communication techniques may be used. While two transmitters 12, 14 are illustrated in the example of FIG. 1, in other embodiments more than two transmitters, for example more than two sensors or other devices, may be provided in communication system 10.

It should be noted that in this context, the term "transmitter" is used to designate entities which send payload data, for example measured sensor data, while the receiver is the entity which receives such data. This notwithstanding, in embodiments discussed herein the receiver may send control data, in particular a trigger signal, to trigger transmission of this payload data by the transmitters, as will be discussed below in more detail. In other embodiments, receiver 11 may be a transceiver, and/or transmitters 12, 14 may be transceivers (i.e. combined transmitters/receivers) for full bidirectional communication.

In some embodiments, receiver 11 sends a trigger signal via communication path 13. In some embodiments, a predetermined trigger signal, e.g. a trigger pulse with a predetermined pulse length, may trigger an action both in transmitter 12 and in transmitter 14. In some embodiments, in response to the trigger pulse both transmitters 12 and 14 may consecutively transmit data to receiver 11. For example, transmitter 14 may transmit data to receiver 11 upon completion of a data transmission from transmitter 12 to receiver 11.

To this end, as will be discussed below in more detail, transmitters 12, 14 may comprise timers which are started responsive to the trigger signal, and when the timer of a respective transmitter elapses, the respective transmitter starts transmitting data.

Additionally, transmitters 12, 14 may e.g. be sensors and sample data to be transmitted later upon receipt of the predetermined trigger pulse. In other embodiments, other techniques may be employed.

Figure 2:
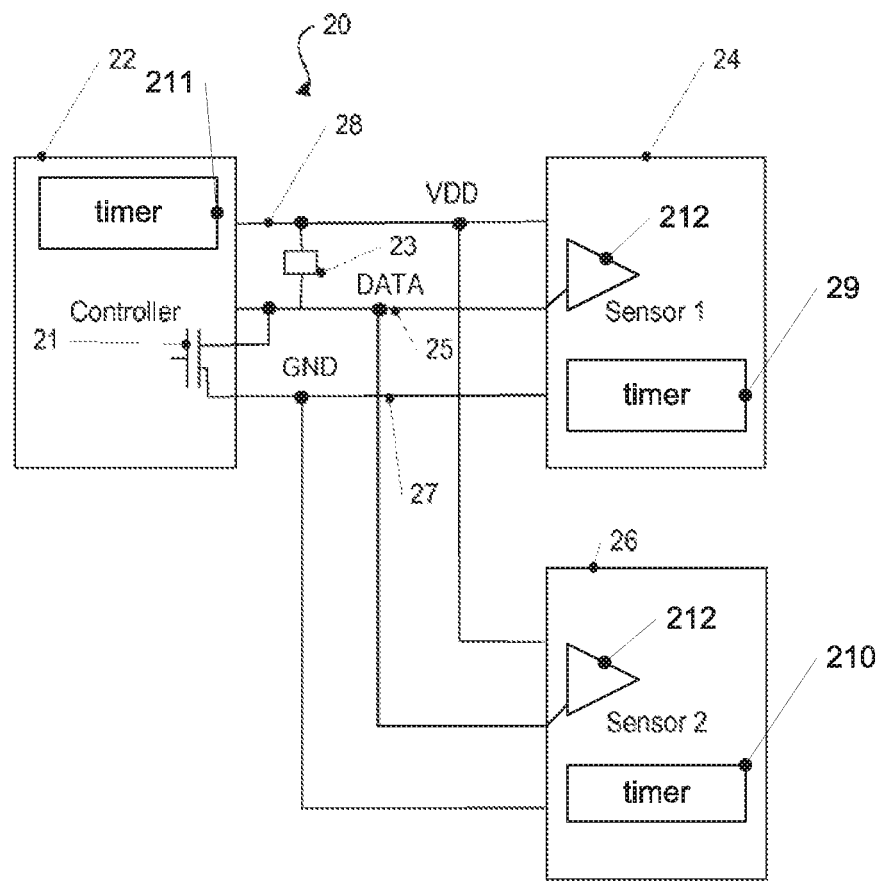
FIG. 2 is a block diagram of a communication system according to an embodiment.

In some other embodiments, as illustrated in FIG. 2, a receiver or other controller 22 (e.g. master device) may communicate with a plurality of transmitters, in this example sensors 24 and 26 (slave devices) in a system 20. Controller 22 in the embodiment shown is electrically coupled to each of sensors 24 and 26 via a three-wire connection. In other embodiments, two-wire connections or any other connections may be used. Controller 22 may communicate with sensors 24 and 26 e.g. via an SPC protocol or other bidirectional edge-based PWM protocol. In the embodiment shown in FIG. 2, a three-wire connection electrically coupling controller 22 to first sensor 24 and second sensor 26 comprises a VDD power supply line 28, a data line 25 and a reference line such as ground line 27. In an embodiment, system 20 may be part of an automobile's electrical system. In other embodiments, other numbers of sensors or other components may be used.

In an embodiment, controller 22 communicates with first sensor 24 and second sensor 26 via open drain/open collector interfaces including one or more pull-up resistors. For example, system 20 includes a pull-up resistor 23 that has a first end electrically coupled to power supply line 28 and a second end electrically coupled to data line 25, and controller 22 includes an open drain transistor 21 that has one end of its drain-source path electrically coupled to data line 25 and the other end electrically coupled to ground line 27. Sensors 24 and 26 may comprise similar open drain transistors or current sinks (not shown). A voltage level on data line 25 may then for example be detected by comparators 212 in sensor 24 or 26. When sensors 24, 26 transmit data, a corresponding comparator in controller may detect the voltage on data line 25. Any other conventional transmit circuits and receive circuits may also be used instead of pulldown transistor 21 and comparators 212. For example, in other embodiments, push-pull drivers may be used in controller 22 and/or sensors 24, 26.

Controller 22 and each of the first and second sensors 24 and 26 share a single communication path that is communicating via voltage signals on data line 25, e.g. PWM signals. Controller 22 and each of the first and second sensors 24, 26 may comprise further circuitry components for transmitting and receiving data, for example logic circuits and/or drive circuits for controlling transistor 21 or other drivers to transmit corresponding pulses on data line 25. Such components may be implemented in hardware, software, firmware or combinations thereof.

When communicating for example according to an SPC protocol, controller 22 may transmit a request signal that is received by the first and second sensors 24 and 26 via data line 25. The request signal may include a trigger signal (pulse). In addition, a remainder of the request signal may include any other commands and/or data to be transmitted to the selected sensor. For example, the trigger signal may be a pulse where controller 22 via transistor 21 pulls data line 25 to ground, a duration of the pulse indicating that sensors 24, 26 are to transmit captured sensor data to controller 22. In other embodiments current pulses or other electrical quantities may be used to achieve the same functionality.

The first and second sensors 24 and 26 receive the request signal including the trigger signal. In conventional approaches, one of the first and second sensors 24 and 26 is selected via a sensor identification signal, for example encoded in a pulse width of the trigger pulse, pulse height or other, and the selected sensor transmits a reply signal via data line 25.

In some embodiments, at least one predetermined trigger signal, for example a trigger pulse having a predefined length, starts a timer 29 in first sensor 24 and a timer 210 in second sensor 26. When the timer 29 of sensor 24 elapses, sensor 24 starts transmitting data. When timer 210 of sensor 26 elapses, second sensor 26 starts transmitting data. A timer elapses for example when it reaches a predefined time value when counting up or reaching zero when counting down. The time until a timer elapses after it has been started is referred to as associated time period herein. Timers 29, 210 have associated time periods, such that first and second sensors 24, 26 transmit their data consecutively, i.e. one after the other. This will be explained further below using example signals. It should be noted that in system with more than two sensors 24, 26, different request signals, for example trigger pulses of different lengths, may be used to start timers in different groups of sensors or a single trigger pulse may start timers in all sensors.

In some embodiments, also controller 22 may comprise a timer 211, and the transmission of request signals may be based on this timer, for example in regular intervals. The timing may be selected such that between trigger signals all sensors the timer of which is started by the respective trigger signal may complete their transmission before a next trigger signal is sent via the bus.

In some embodiments, additionally the trigger signal may cause both first sensor 24 and second sensor 26 to capture data at least approximately at the same time, such that their respective transmissions may be indicative of sensor data captured at approximately the same time. In other embodiments, each sensor may capture its data immediately prior to transmission.

Figure 3:
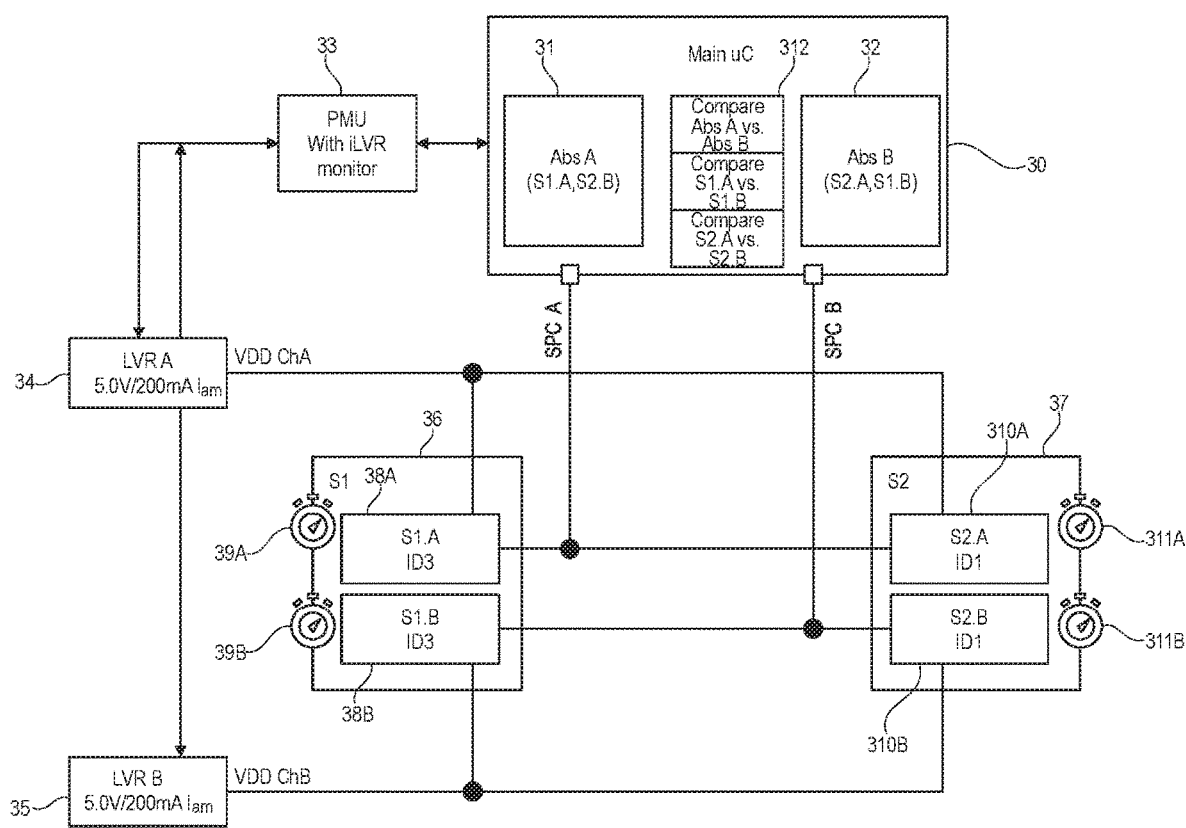
FIG. 3 is a block diagram of a specific implementation of a communication system according to an embodiment.

FIG. 3 illustrates a system according to an embodiment. The system in FIG. 1 may for example be an implementation for some automotive applications like sensing of rotational speed using magnetic field sensors. However, this is only a non-limiting example, and techniques described herein may be used in various environments and applications.

The system of FIG. 3 comprises a first sensor device 36 and a second sensor device 37. First sensor device 36 comprises a first sensor 38A and a second sensor 38B. Second sensor device 37 comprises a third sensor 310A and a fourth sensor 310B. First and second sensor devices 36, 37 with first through fourth sensors 39A, 39B, 310A and 310B may be provided for redundancy reasons, e.g. to perform multiple measurements which are then compared, and wherein deviations between measurements from different sensors may indicate a fault condition e.g. in at least one sensor.

First sensor 39A and third sensor 310A are supplied by a first voltage regulator 34 with a supply voltage VDDChA. Second sensor 38B and fourth sensor 410B are supplied by a second voltage regulator 35 with a second supply voltage VDDChB. Providing two separate supply voltages in some embodiments may help to fulfil safety requirements, in that when one voltage supply fails the other may still be operative. In other implementations, a single voltage regulator generating a single supply voltage may be provided.

First sensor 38A and third sensor 310A are coupled to a main microcontroller 30 via a first SPC bus SPC A. Second sensor 38B and fourth sensor 310B are coupled to main microcontroller 30 via a second SPC bus SPC B. Using two SPC buses SPC A, SPC B again provides redundancy and may help to be able to provide at least some amount of functioning in case one SPC bus fails. In other embodiments, a single SPC bus or other edge-based pulse width modulation protocol bus may be used. In other words, the number of sensors and their connection with power supplies and microcontroller 30 in FIG. 3 is merely an example, and other arrangements having more sensors or fewer sensors may also be used. In some embodiments, main microcontroller 30 may be an ECU (electronic control unit) in an automotive environment.

Microcontroller 30 may form a first value A based on outputs of sensors 38A, 310B and as indicated at 31, and a second value B based on outputs of sensors 38B, 310A as indicated at 32. Values A, B may for example be absolute angular values in case sensors 38A, 38B, 310A and 310B are used as angular sensors. These values may then be compared, and values of individual sensors may also be compared, as indicated by a block 312. Deviations between the sensors may for example indicate a possible fault of one or more of the sensors and/or connections.

Furthermore, the system of FIG. 3 comprises a phase measurement unit (PMU) to monitor voltage regulators 34, 35 and to alert microcontroller 30 in case a malfunction of voltage regulators 34, 35 is detected.

In the embodiment of FIG. 3, sensor 38A includes a timer 39A, sensor 38B includes a timer 39B, sensor 310A includes a timer 311A and sensor 310B includes a timer 311B.

In some embodiments, to read out sensors 38A and 310A, main microcontroller 30 sends a predefined trigger signal via first SPC bus SPCA. This predefined trigger pulse starts timers 39A, 311A. When timer 39A elapses, sensor 38A sends data indicating a measured quantity to main microcontroller 30. When timer 311A elapses, sensor 310A sends data indicating a measured value to main microcontroller 30. Predefined time periods for timers 39A, 311A are selected such that no collision occurs, i.e. sensors 39A, 311A send their data consecutively. In a similar manner, in the embodiment of FIG. 3 to read out sensors 38B, 310B, a corresponding scheme may be used where a trigger sensor signal is sent via second SPC bus SPCB, and sensors 38B which starts timers 39B, 311B, and sensors 38B, 310B then send their data when the respective timer has elapsed.

Figure 4:
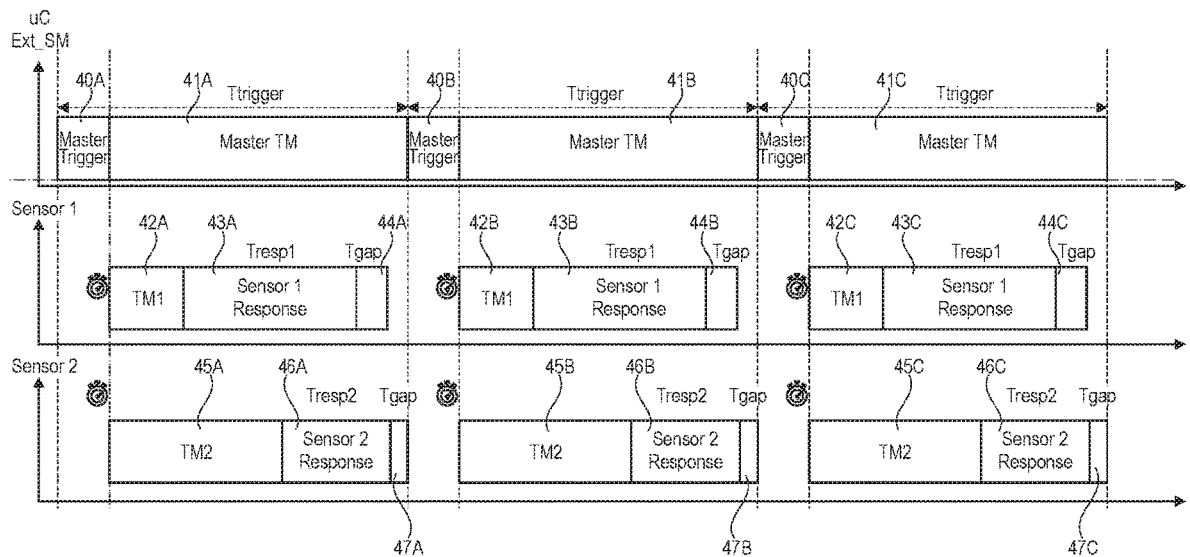
FIG. 4 is a diagram illustrating example signals of some embodiments.
Figure 5:
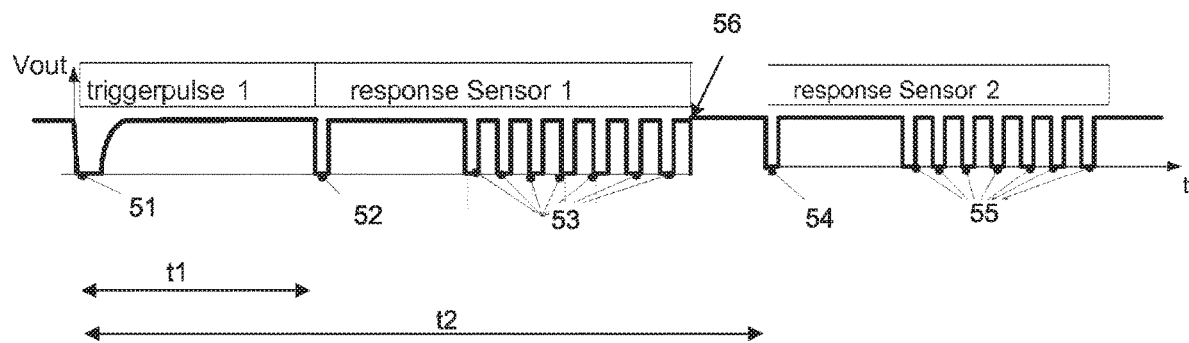
FIG. 5 is a diagram illustrating example signals of some embodiments.

This will now be further illustrated using example signal schemes referring to FIGS. 4 and 5. Similar to FIGS. 1, 2 and 3, the examples of FIGS. 4 and 5 use two bus slaves, for example two sensors, as a non-limiting example. However, in other embodiments, more than two sensors may be used. Furthermore, while sensors are used as an example for slave devices in some embodiments, in other embodiments any other devices to transmit data to a master may be employed.

In FIG. 4, a communication between a microcontroller (uC) and two sensors (sensor 1, sensor 2) over time is shown. At 40A, the microcontroller sends a master trigger signal. This master trigger signal starts a timer in a first sensor and a timer in a second sensor. After an associated time period 42A of the first sensor passed and the timer of the first sensor thus is elapsed, at 43A the first sensor sends a response to the microcontroller. After an associated time period 45A of the second sensor has passed and therefore the timer of the second sensor is elapsed, at 46A the second sensor sends a response to the microcontroller. The time period 45A is selected to be long enough to accommodate the time period 42A and the longest sensor response 43A so provide a safety margin for collision avoidance. Additionally, the time period 45A is selected to accommodate a gap period 44A having a length Tgap acting as a further safety margin to surely avoid collisions between the response 43A from the first sensor and the response 46A from the second sensor, i.e. to avoid that sensor responses 43A, 46A overlap.

The length Tgap may be selected to accommodate various issues like clock drifts of clocks clocking the sensors as well as varying length of the sensor response. For example, bus systems like SPC use a pulse width modulation scheme, where the length of pulses depends on data to be encoded, and therefore the length of the response may depend on encoded data.

Furthermore, if an internal clock of a sensor used e.g. for clocking the time and/or the response drifts, in some cases, this may also lead to a varying length of the sensor response. As an example, the oscillator frequency fosc of an internal clock sensor due to drift may vary in a range of ±5% of a target clock frequency. This tolerance of ±5% is merely an example, and may depend on the implementation of an oscillator in the sensor as well as on environmental variations like temperature variations. Therefore, a tolerance to be taken into account may be varied depending on implementation and environment.

For determining the time gap 44A, it may then be assumed that the clock of the first sensor is slow (e.g. +5%) and the clock of the second sensor is fast (e.g. −5%). The slow clock of the first sensor increases the time for the time period 42A and for the sensor response 43A, and the fast clock of the second sensor reduces the time gap 45A. In such a case, the time period 45A may then be selected to be a sum of the time period 42A in the slow case (+5% in the above example) plus the maximum time for the response 43A plus a time gap 44A, for example 12 nibbles of a SENT protocol (examples for such nibbles will be discussed further below referring to FIG. 5).

After both responses 43A, 46A are sent and after a time gap 47A, the master sends a further master trigger signal 40B, and the cycle begins anew. The master trigger signals 40A, 40B are separated by a master time period 41A, which may be measured by a timer incorporated in the respective master device. The master time period is selected to accommodate the time period 45A (calculated as above to account for tolerances), a maximum sensor response 46A plus the time gap 47A, which again may for example be 12 nibbles. With such a scheme, collisions on the bus may be avoided in some embodiments. Nevertheless, depending on the precision of the clocks, time gaps may be shortened or omitted in other embodiments.

As mentioned, with the sending of the next master trigger 40B, the signaling begins anew. Overall, in FIG. 4 three periods are shown. The second period (started with master trigger 40B) and a third period started with a master trigger 40C are executed in the same manner as the above-described first period, and similar elements bear the same reference numerals, where the "A" of the first period is replaced by a "B" for the second period and by a "C" for the third period. Therefore, these elements will not be described again in detail.

In the embodiment of FIG. 4, as discussed, the various transmissions (master trigger and sensor responses) are repeated periodically with a period Ttrigger. In other embodiments, master trigger signals like master trigger signals 40A, 40B and 40C may be sent in irregular intervals, for example only when a master device like a microcontroller needs data from slave devices. In other embodiments, as will be explained further below in more detail, Ttrigger may be modified e.g. depending on the length of sensor responses.

Next, an example of a voltage Vout on a bus (e.g. data line 25 of FIG. 2) when executing a signaling scheme as discussed with reference to FIG. 4 will be discussed referring to FIG. 5. The voltage Vout shown in FIG. 5 is merely an example, and depending on a protocol used or specific sensor responses other voltages may apply. The signals in FIG. 4 may for example be generated in the system of FIG. 2 by coupling the data line 25 to ground via transistor 21 on the master side and similar transistors on the slave side (sensors 24 and 26).

The signaling in FIG. 5 starts with a trigger pulse 51, where a master (for example controller 22) pulls down the voltage for a predefined time period. The length of the time period may indicate that a plurality of sensors, in the example of FIG. 5 two sensors, should respond to the trigger pulse. This trigger pulse 51 starts a timer in each sensor (for example timers 29, 210 in FIG. 2 or timers 39A, 39B, 311A, 311B in FIG. 3).

After the timer in the first sensor has elapsed after a first associated time period t1, the first sensor starts transmitting its response. In the example of FIG. 5, the response of the first sensor starts with a synchronization pulse 52 followed by a plurality of data nibbles 53. These data nibbles may also be referred to as data pulses. A width of the data nibbles may correspond to respective bit values. In some embodiments, operating for example to some SPC implementations, a predetermined number of data nibbles, for example seven data nibbles, may be used, although the number of data nibbles varies in other implementations.

The first predetermined time t1 may in particular be selected to accommodate all possible lengths of trigger pulses, including margins (time gaps) as discussed above, and may correspond to the time periods 42A, 42B and 42C of FIG. 4.

The timer of the second sensor elapses after a second associated time period t2. The second associated time period t2 is selected to accommodate trigger pulse 52 and the response of the first sensor and may correspond to time periods 45A, 45B and 45C of FIG. 4. After the second timer has elapsed, the second sensor sends its response in the example of FIG. 5 including a synchronization pulse 54 followed by a number of data nibbles 55. In some embodiments, after the second sensor response, further sensors may send their responses in the same manner. In other embodiments, for example embodiments including only two sensors, a next trigger pulse may be sent after the response of sensor 2, as explained for master trigger signal 40B in FIG. 4.

As can be seen in FIG. 5, in some embodiments, by using a single trigger pulse triggering a plurality of sensor responses, an overall time needed may be reduced compared to a case where a trigger pulse has to be sent for each sensor separately.

Figure 6:
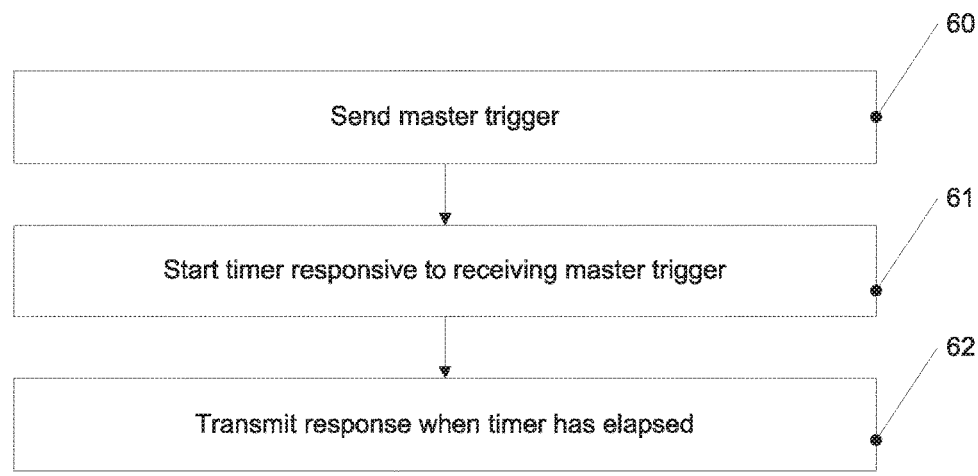
FIG. 6 is a flowchart illustrating a method according to some embodiments.

FIG. 6 is a flowchart illustrating a method according to some embodiments. For ease of illustration and to avoid repetitions, the method of FIG. 6 will be explained referring to FIGS. 1-5. However, it should be noted that the method of FIG. 6 may also be employed in other systems and devices than the ones explicitly shown and described referring to FIGS. 1-5.

At 60, the method of FIG. 6 includes sending a master trigger signal, for example, master trigger signals 40A, 40B or 40C of FIG. 4 or trigger pulse 51 of FIG. 5.

At 61, in response to receiving the master trigger signal, each of a plurality of slave devices starts its respective timer (for example timer 29, 210 of FIG. 2 or timers 39A, 39B, 311A, 311B of FIG. 3).

At 62, each slave device transmits a response to the master trigger when its timer has elapsed, i.e. when a respective associated time period assigned to each slave device has passed. The time periods may be selected as explained with reference to FIGS. 4 and 5, such that the slave devices transmit their response one after the other without collision on the bus. For example, the predefined time periods may include time gaps as safety margins to prevent bus collisions even in case of a clock drift, as discussed above.

In the above-described embodiments, the associated time periods assigned to the respective slave devices are fixed. In other embodiments, the time periods may be variable. Embodiments where the time periods may be variable will now be explained referring to FIG. 7.

Figure 7:
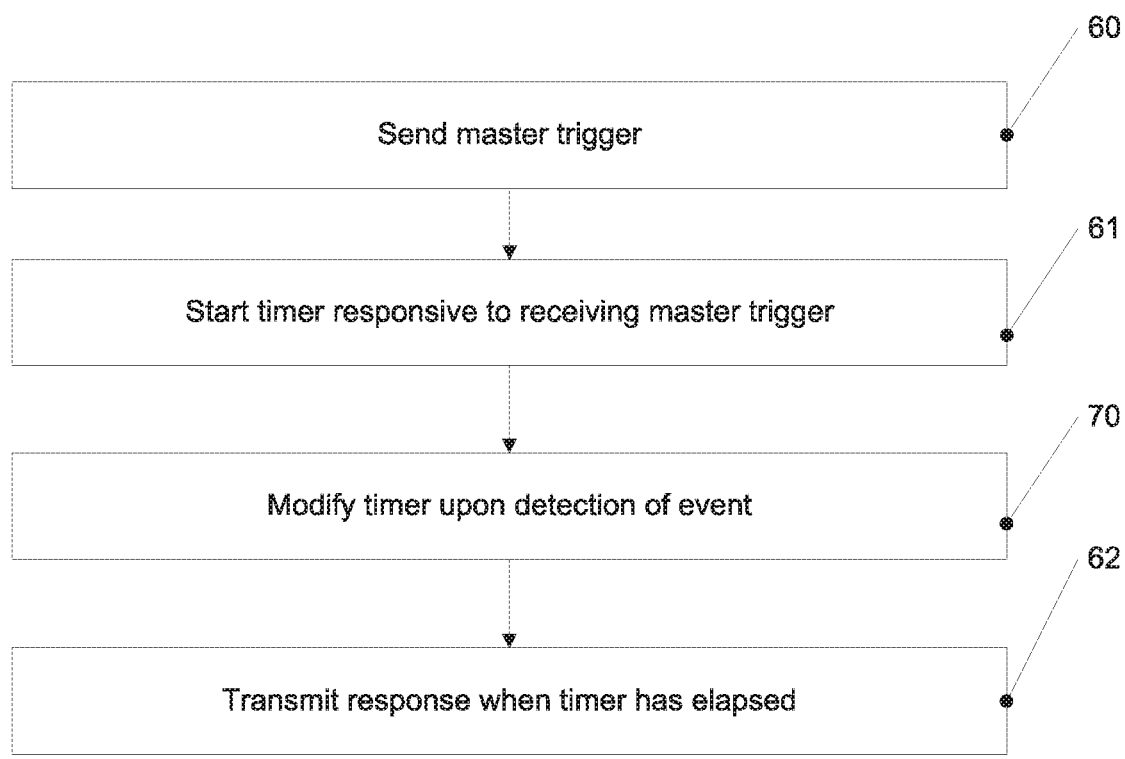
FIG. 7 is a flowchart illustrating a method according to some embodiments.

FIG. 7 is a flowchart of a method according to an embodiment. The method of FIG. 7 will for ease of reference be described referring to the previous figures and associated description. Acts or events in the method of FIG. 7 which correspond to acts or events of the method of FIG. 6 bear the same reference numerals and will only be described briefly to avoid repetitions.

At 60 in FIG. 7, the method comprises sending a master trigger signal. At 61, the method comprises starting a respective timer in each of a plurality of slave devices responsive to receiving the master trigger signal.

At 70, the method of FIG. 7 comprises modifying the timer upon a detection of an event. This modification may dynamically adjust the timer to dynamically adjust the time between transmitting the sensor responses.

For example, in some embodiments, each slave device, after the actual response and at the beginning of the time gap (for example 44A-C and 47A-C in FIG. 4) may send a predefined end-of-frame symbol, for example a nibble having a predefined length. This predefined end-of-frame symbol which marks the end of the transmission by a slave device in some embodiments may be detected by other slave devices on the bus. In response to detecting the end-of-frame symbol of a previously transmitting sensor, a next slave device to transmit data may, at 70 in FIG. 7, set its timer to elapsed, even if the associated time period assigned to this sensor has not yet completely passed. Then, at 62, this sensor transmits its response when the timer has elapsed, i.e. after setting the timer to elapsed at 70.

In this way, in some embodiments, overall transmission time needed may be reduced.

In some other embodiments, the master may count the end-of-frame symbols transmitted by the various slave devices as described above, and upon reaching a predefined number corresponding to the number of slave devices expected to respond (two in the examples above) may set its own timer to elapsed, and immediately send a next master trigger signal (for example send master trigger pulse 40B after the end-of frame symbol at time gap 47A has been detected).

In some other embodiments, instead of detecting the above-mentioned end-of-frame symbol sent by a previously transmitting sensor at the event at 70 in FIG. 7, the master device, after receiving a complete valid response from a sensor, may transmit a predefined completion signal, for example a pulse having a predefined length different than the length of the trigger. For example, the master device may transmit such a predefined pulse at a position marked with an arrow 56 in FIG. 5 after the response of the first sensor is complete. Similar to what has been explained above, a next sensor to transmit data may detect this predefined signal sent by the master and set its timer to elapsed, to immediately start transmitting.

In yet other embodiments, detecting the event at 70 may include detecting, at a slave device, a time period between an end of a previous transmission (for example by detecting the end-of-frame symbol sent by a previous slave device and discussed above) or a predefined completion signal sent by the master as discussed above, and the start of its own transmission according to the timer. Depending on this detected time, the sensor may modify its time period used for a next transmission. For example, if in FIG. 4 the second sensor finds that the time period 45A is much longer than the time needed for sensor response 43A, it may reduce its next time period 45B. In this way, the time periods may be adjusted to bus conditions and/or clock drifts.

With all these variations, in some embodiments through the modification of the timer at 70 an overall time needed for transmission may be reduced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

LIST OF REFERENCE NUMERALS 10 system
11 receiver
12 transmitter
13 communication path
14 transmitter
20 system
21 transistor
22 controller
23 resistor
24 sensor
25 data line
26 sensor
27 ground line
28 voltage line
29 timer
210 timer
211 timer
212 comparator
30 microcontroller
31 block
32 block
33 PMU
34 voltage supply
35 voltage supply
36 sensor device
37 sensor device
38A, 38B sensors
39A, 39B timers
310A, 310B sensors
311A, 311B timers
312 block
40-47 signals
51 trigger pulse
52 synchronization pulse
53 nibbles
54 synchronization pulse
55 nibbles
56 completion signal
60-62 method acts or events
70 method act or event

What is claimed is:

1. A slave device, comprising:
a communication circuit configured to communicate based on a bidirectional edge-based pulse width modulation protocol; and
a timer configured to start when the communication circuit receives a predefined trigger signal and to elapse upon expiration of an associated time period after a starting of the timer,
wherein the communication circuit is configured to transmit a response to the predefined trigger signal when the timer elapses,
wherein the associated time period has a length to accommodate at least one further response transmitted by at least one further slave device.

2. The slave device of claim 1, wherein the associated time period is selected to account for a clock drift of the slave device or the at least one further slave device.

3. The slave device of claim 1, wherein the communication circuit is configured to transmit a predefined end-of-frame symbol after transmitting the response.

4. The slave device of claim 1, wherein the timer is configured to be set to elapse when the communication circuit receives a predefined end-of-frame signal from the at least one further slave device indicating that the at least one further response is complete.

5. The slave device claim 1, wherein the timer is configured to be set to elapse when the communication circuit receives an indication from a master device that the at least one further slave device has completed the at least one further response.

6. The slave device of claim 1, wherein the slave device is configured to determine a time difference between an end of the at least one further response transmitted by the at least one further slave device and a time when the timer elapses upon expiration of the associated time period, and to modify the associated time period based on the determined time difference.

7. A master device, comprising:
a communication circuit configured to communicate based on a bidirectional edge-based pulse width modulation protocol,
wherein the master device is configured to send a predefined trigger signal to a plurality of slave devices, and to receive responses from at least two of the plurality of slave devices in response to the predefined trigger signal one after the other,
wherein the communication circuit is configured to transmit a predefined completion signal after each received response.

8. The master device of claim 7, wherein the communication circuit is configured to transmit the trigger signal periodically.

9. The master device of claim 7, wherein the communication circuit is configured to transmit different trigger pulses to trigger responses from different groups of the plurality of slave devices.

10. The master device of claim 7, wherein the communication circuit is configured to transmit a completion signal after detecting an end of frame symbol in each received response.

11. The master device of claim 7, wherein the bidirectional edge-based pulse width modulation protocol is a short pulse width modulation code (SPC) protocol.

12. A communication system, comprising:
a master device comprising a communication circuit configured to transmit a master trigger signal on a bus; and a plurality of slave devices coupled to the bus, each slave device comprising:
- a communication circuit coupled to the bus; and
- a timer configured to start when the communication circuit of the respective slave device receives the master trigger signal, and to elapse upon expiration of a respective associated time period after the timer has been started,
- wherein the communication circuit is configured to transmit a response to the master trigger signal when the timer elapses, and
- wherein respective associated time periods of different slave devices differ from each other.

13. A communication method, comprising:
receiving a master trigger signal according to a bidirectional edge-based pulse width modulation protocol;
starting a timer in response to receiving the master trigger signal, wherein the timer elapses upon expiration of an associated time period after starting; and
transmitting a response to the master trigger signal when the timer elapses,
wherein the associated time period has a length to accommodate at least one further response transmitted by a further slave device.

14. The method of claim 13, further comprising: modifying the timer upon detection of an event.

15. The method of claim 14, wherein modifying the timer comprises setting the timer to elapse when the event indicates a completion of the at least one further response.

16. The method of claim 14, wherein modifying the timer comprises modifying the associated time period depending on a time between a completion of the at least one further response and a start of transmitting the response.

17. A communication method, comprising:
sending a master trigger signal according to a bidirectional edge-based pulse width modulation protocol over a bus;
in a plurality of slave devices, starting a respective timer in each slave device responsive to receiving the master trigger signal; and
in each of the plurality of slave devices, transmitting a response when the respective timer of the slave device has elapsed, wherein respective timers of the plurality of slave devices elapse after different associated time periods.

18. The method of claim 17, wherein the different associated time periods are selected to avoid collisions between the responses of the plurality of slave devices.

* * * * *